(12) United States Patent
Otsubo et al.

(10) Patent No.: US 10,231,331 B2
(45) Date of Patent: Mar. 12, 2019

(54) MULTILAYER WIRING BOARD AND PROBE CARD HAVING THE SAME

(71) Applicant: Murata Manufacturing Co., Ltd., Kyoto (JP)

(72) Inventors: Yoshihito Otsubo, Kyoto (JP); Takayuki Tsukizawa, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/160,203

(22) Filed: May 20, 2016

(65) Prior Publication Data

US 2016/0270222 A1     Sep. 15, 2016

Related U.S. Application Data

(63) Continuation of application No. PCT/JP2014/079553, filed on Nov. 7, 2014.

(30) Foreign Application Priority Data

Nov. 20, 2013 (JP) .................... 2013-239554

(51) Int. Cl.
*H05K 1/02*     (2006.01)
*H05K 1/11*     (2006.01)
*H05K 3/46*     (2006.01)

(52) U.S. Cl.
CPC .......... *H05K 1/0298* (2013.01); *H05K 1/115* (2013.01); *H05K 3/4682* (2013.01);
(Continued)

(58) Field of Classification Search
CPC .......... H01L 23/49838; H01L 23/5389; H01L 24/19; H01L 2224/04105;
(Continued)

(56) References Cited

U.S. PATENT DOCUMENTS 2,877,427 A      3/1959  Butler
6,132,543 A *  10/2000  Mohri .................. H05K 3/207
                                                              156/230
(Continued)

FOREIGN PATENT DOCUMENTS

CN        1482097 A       3/2004
CN       101594753 A     12/2009
(Continued)

OTHER PUBLICATIONS

International Search Report issued in Application No. PCT/JP2014/079553 dated Jan. 6, 2015.
(Continued)

*Primary Examiner* — Timothy J Thompson
*Assistant Examiner* — Guillermo J Egoavil
(74) *Attorney, Agent, or Firm* — Pearne & Gordon LLP

(57) ABSTRACT

A multilayer wiring board includes: a multilayer body including a plurality of insulating layers; a lower outer electrode provided on a lower surface of the multilayer body; a first via conductor connected at one end to the lower outer electrode; a first in-plane conductor connected to another end of the first via conductor; a second via conductor provided within the multilayer body on a surface of the first in-plane conductor on the opposite side from a surface of the first in-plane conductor in a position distanced from the first via conductor viewed in a direction orthogonal to a layering direction of the multilayer body, one end of the second via conductor being connected to the first in-plane conductor; and a second in-plane conductor connected to another end of the second via conductor. A line width of the first in-plane conductor is narrower than that of the second in-plane conductor.

20 Claims, 10 Drawing Sheets

(52) U.S. Cl.
CPC ............... *H05K 2201/0969* (2013.01); *H05K 2201/09227* (2013.01); *H05K 2201/09727* (2013.01); *H05K 2201/09781* (2013.01)

(58) Field of Classification Search
CPC . H01L 2224/32225; H01L 2224/73267; H01L 2224/92244; H01L 2924/12042; H01L 2924/15153; H01L 2924/18162; H05K 1/02; H05K 1/0298; H05K 1/11; H05K 1/115; H05K 1/182; H05K 1/185; H05K 3/4682; H05K 2201/09227; H05K 2201/0969; H05K 2201/09727; H05K 2201/09781; Y10T 29/49126; Y10T 29/49165; Y10T 428/24322
USPC .................................. 174/262, 261; 361/761
See application file for complete search history.

(56) References Cited

U.S. PATENT DOCUMENTS

| | | | |
|---|---|---|---|
| 6,924,245 B2 | 8/2005 | Sakamoto | |
| 8,110,749 B2 | 2/2012 | Yoshimura et al. | |
| 2003/0029636 A1* | 2/2003 | Carpenter | H05K 1/115 174/260 |
| 2007/0175657 A1* | 8/2007 | Itoh | H05K 1/0271 174/260 |
| 2008/0233370 A1* | 9/2008 | Nakao | G01L 1/2287 428/210 |
| 2012/0300425 A1* | 11/2012 | Nakashima | H01L 23/49838 361/761 |
| 2013/0069238 A1* | 3/2013 | Usami | H01L 21/76897 257/769 |
| 2013/0119562 A1* | 5/2013 | Shimizu | H01L 23/48 257/782 |
| 2014/0097009 A1* | 4/2014 | Kaneko | H01L 23/49822 174/258 |
| 2014/0176254 A1 | 6/2014 | Iida | |
| 2014/0209356 A1* | 7/2014 | Sakai | H05K 1/115 174/251 |
| 2015/0223318 A1* | 8/2015 | Sakamoto | H05K 1/0206 361/717 |
| 2015/0311232 A1* | 10/2015 | Sun | G02F 1/136227 257/72 |

FOREIGN PATENT DOCUMENTS

| | | |
|---|---|---|
| JP | H06-334351 A | 12/1994 |
| JP | H07-106159 B2 | 11/1995 |
| JP | H11-261204 A | 9/1999 |
| JP | H11-346057 A | 12/1999 |
| JP | 2002-151917 A | 5/2002 |
| JP | 2005-032901 A | 2/2005 |
| JP | 2005-044988 A | 2/2005 |
| JP | 2006-352347 A | 12/2006 |
| JP | 2007-165680 A | 6/2007 |
| JP | 2008-186919 A | 8/2008 |
| JP | 2010-199109 A | 9/2010 |
| JP | 2011-009694 A | 1/2011 |
| JP | 2013-102047 A | 5/2013 |
| JP | 2013-191678 A | 9/2013 |
| WO | 2010/010910 A1 | 1/2010 |
| WO | 2011/058879 A1 | 5/2011 |
| WO | 2011/089936 A1 | 7/2011 |
| WO | 2013/114974 A1 | 8/2013 |
| WO | 2013/058351 A1 | 4/2015 |

OTHER PUBLICATIONS

Written Opinion issued in Application No. PCT/JP2014/079553 dated Jan. 6, 2015.
Notice of Reasons for Rejection issued in Japanese Patent Application No. 2015-549070 dated Apr. 4, 2017.

* cited by examiner

FIG. 4
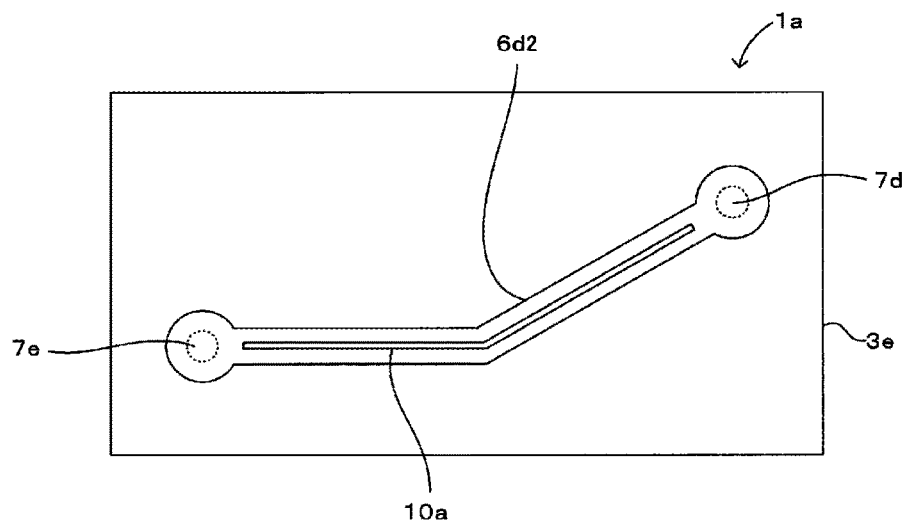
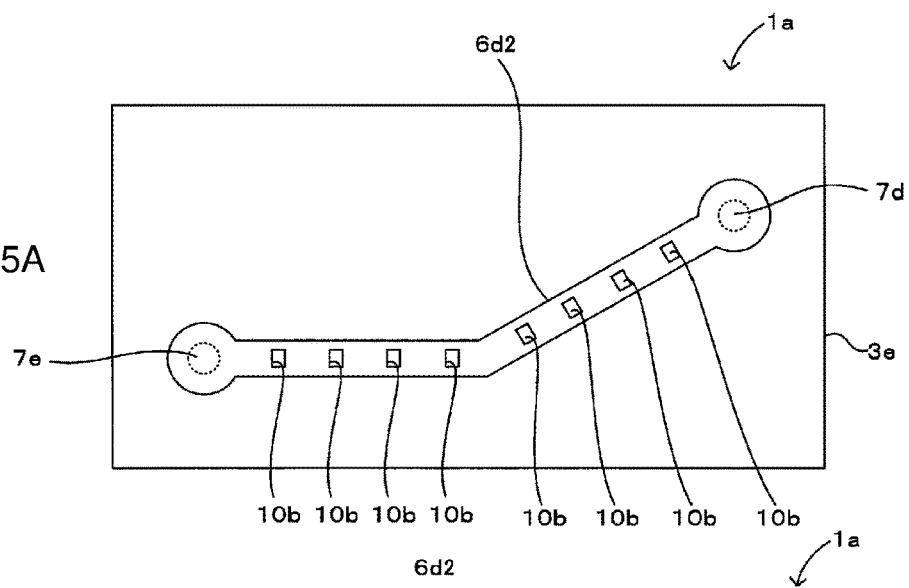
FIG. 5A
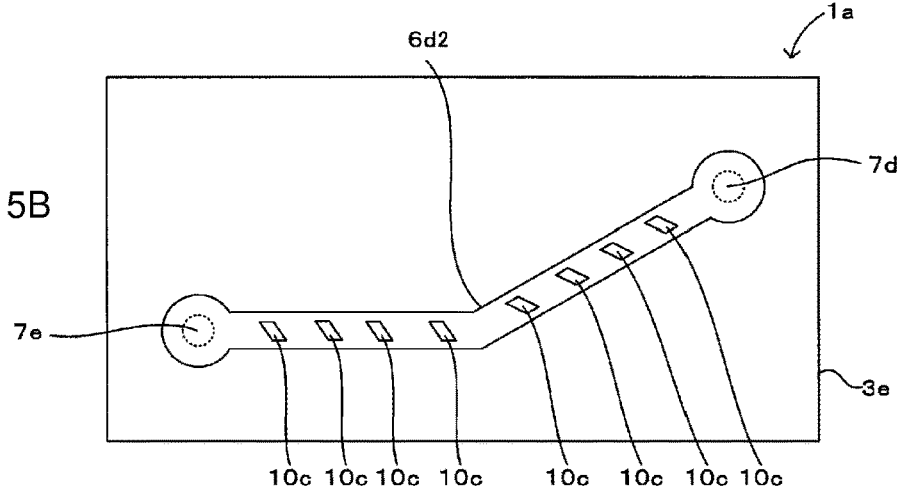
FIG. 5B

MULTILAYER WIRING BOARD AND PROBE CARD HAVING THE SAME

BACKGROUND

Technical Field

The present disclosure relates to a multilayer wiring board including in-plane conductors and via conductors therein, and to a probe card including such a multilayer wiring board.

As the miniaturization of electronic devices progresses, multilayer wiring boards in which three-dimensional wiring structures can be formed are being widely employed as wiring boards for forming electric circuits. For example, Patent Document 1 discloses a multilayer wiring board used in a probe card for inspecting the electrical characteristics of an IC or the like. As illustrated in FIG. 13, this multilayer wiring board 100 includes a multilayer body 104 constituted by laminating together a plurality of insulating layers 101a to 101f, each of which is formed from a ceramic material. In-plane conductors 102a to 102f are formed in main surfaces of the insulating layers 101a to 101f, respectively, and pluralities of via conductors 103a to 103f that connect predetermined in-plane conductors 102a to 102f disposed in mutually different insulating layers 101a to 101f to each other are also formed in the insulating layers 101a to 101f, respectively.

Here, the in-plane conductors 102a formed on an upper surface of the multilayer body 104 are used as electrodes for connecting a probe pin, and the in-plane conductors 102f formed on a lower surface of the multilayer body 104 are used as electrodes for an external connection. The pitch of the via conductors 103a to 103f formed in corresponding insulating layers 101a to 101f widens as the layers progress from a top layer to a bottom layer, and a rewiring structure is formed in the multilayer wiring board 100. The multilayer wiring board 100 is made smaller by forming the wires provided in the multilayer wiring board 100 in both a planar direction and a layering direction of the multilayer body 104.

Patent Document 1: Japanese Unexamined Patent Application Publication No. 2011-9694 (see paragraph 0021, FIG. 1, and so on)

BRIEF SUMMARY

Incidentally, the stated conventional multilayer wiring board 100 is manufactured by stacking the insulating layers 101a to 101f formed from a ceramic material in a predetermined order and then pressure bonding/firing those layers together. Here, there are cases where the pressure applied during the pressure bonding/firing causes the in-plane conductors 102a to 102f connected to the via conductors 103 to be pressed by the via conductors 103 and separate from the insulating layers 101a to 101f.

For example, as illustrated in FIG. 13, of the in-plane conductors 102e located on the side of the in-plane conductor 102f (outer electrode) one layer thereabove, which is formed in the lower surface of the lowermost insulating layer 101f, the in-plane conductor 102e located on a left end in the diagram is connected to the via conductor 103f on the lower layer side at that end side, and is connected to the via conductor 103e on the upper layer side at the other end side. In a configuration where the in-plane conductors 102e, the via conductors 103e, and 103f are disposed in this manner, the in-plane conductors 102e will be pushed upward by the via conductors 103f on the lower layer side and will be pushed downward by the via conductors 103e on the upper layer side during the pressure bonding/firing. Push-up and push-down stress by the via conductors 103e and 103f makes it easy for the in-plane conductors 102e to deform.

Stress produced by the deformation of the in-plane conductors 102e acts on close-contact borders between the in-plane conductors 102e and the insulating layer 101e (or the insulating layer 101f) that makes close contact with the in-plane conductors 102e, which makes it easy for the in-plane conductors 102e to separate from the insulating layer 101e (or the insulating layer 101f). This push-up and push-down stress of the via conductors 103a to 103f is weaker toward the inner layers, and thus the stated problem of separation is particularly prevalent in the in-plane conductors disposed directly below the upper surface or directly above the lower surface of the multilayer body 104.

Although a method that improves the strength of the close contact between the insulating layers and the in-plane conductors by adding, to the in-plane conductors, the same type of ceramic component as that in the material for forming the insulating layers can be employed as a measure for preventing the in-plane conductors from separating in this manner, this method causes a drop in the electrical characteristics and the like of the in-plane conductors and is therefore difficult to be employed.

Having been achieved in light of the stated problem, the present disclosure provides a technique, in a multilayer wiring board including a multilayer body formed by laminating a plurality of insulating layers together, that can reduce a possibility that an in-plane conductor formed on a main surface of an insulating layer separating from the insulating layer due to stress from a via conductor.

Solution to Problem

To solve the above-described problems, a multilayer wiring board according to the present disclosure includes: a multilayer body formed by laminating a plurality of insulating layers together; an outer electrode formed on one main surface of the multilayer body; a first via conductor provided within the multilayer body and connected at one end to the outer electrode; a first wiring layer including a line-shaped first in-plane conductor directly connected to another end of the first via conductor; a second via conductor provided within the multilayer body on a surface of the first in-plane conductor on the opposite side from a surface of the first in-plane conductor connected to the first via conductor, in a position distanced from the first via conductor by a predetermined distance when viewed in a direction orthogonal to a layering direction (a direction orthogonal to the surface of the first in-plane conductor) of the multilayer body, one end of the second via conductor being connected to the first in-plane conductor; and a second wiring layer including a line-shaped second in-plane conductor connected to another end of the second via conductor. Here, the first in-plane conductor is formed so that a line width thereof is narrower than a line width of the second in-plane conductor.

In this case, the first in-plane conductor connected to the other end of the first via conductor is formed so that the line width of the first in-plane conductor is narrower than the line width of the second in-plane conductor connected to the other end of the second via conductor. In other words, in a single signal path connected to the outer electrode, the first in-plane conductor, which is the in-plane conductor closest to the outer electrode positioned on a surface of the multilayer body, is formed so that the line width of the first in-plane conductor is narrower than the line width of the second in-plane conductor disposed on a layer further inward than the first in-plane conductor.

The first and second in-plane conductors have different thermal shrinkage rates from the insulating layer, and thus a difference in the amount of thermal shrinkage between the in-plane conductors and the insulating layers when pressure bonding/firing the multilayer body increases as the line widths of the first and second in-plane conductors increase; this reduces the strength of close contact with the insulating layer. Accordingly, the line width of the first in-plane conductor, which is highly susceptible to push-up and push-down stress from the first via conductor and the second via conductor during pressure bonding/firing, is made narrower than the line width of the second in-plane conductor. Through this, the strength of close contact between the first in-plane conductor and the insulating layer can be increased (the surface area of a joint between the insulating layer and the in-plane conductor having a low close contact strength can be reduced) as compared to a case where the first in-plane conductor and the second in-plane conductor are formed having the same line width, making it difficult for the first in-plane conductor to separate from the insulating layer when receiving push-up and push-down stress from the first via conductor and the second via conductor during the pressure bonding/firing. In addition, reducing separation of the first in-plane conductor from the insulating layer improves the reliability of the multilayer wiring board.

In addition, a slit that passes through the first in-plane conductor in a thickness direction (a direction perpendicular to the main surface of the insulating layer) of the first in-plane conductor may be provided in the first in-plane conductor. Through this, when pressure bonding/firing the multilayer body, the insulating layers just above and below the first in-plane conductor enter into the slit and form a column, which further improves the effect of reducing the chance of separation of the first in-plane conductor from the insulating layer. Furthermore, providing the slit increases the surface area of the first in-plane conductor per unit length thereof, which improves high-frequency characteristics in the case where a high-frequency signal is used.

In addition, the first wiring layer may include a plurality of the first in-plane conductors, and the first via conductor and the second via conductor may be connected in parallel by the plurality of first in-plane conductors. This makes it possible to handle high currents while reducing the chance of separation of the first in-plane conductors from the insulating layer.

In addition, a dummy via conductor may be provided on a surface of the first in-plane conductor on the opposite side from the surface of the first in-plane conductor connected to the first via conductor, in a position that overlaps with the first via conductor when viewed in plan view. Through this, stress acting on the first in-plane conductor from the first via conductor when pressure bonding/firing the multilayer body is canceled out by stress acting on the first in-plane conductor from the dummy via conductor. In other words, stress received by the first in-plane conductor from the first via conductor when pressure bonding/firing the multilayer body is reduced, which further improves the effect of reducing the chance of separation of the first in-plane conductor from the insulating layer.

In addition, a plurality of the insulating layers may be provided between the outer electrode and the first wiring layer; each of the insulating layers between the outer electrode and the first wiring layer may be thinner than the insulating layers aside from the insulating layers between the outer electrode and the first wiring layer; and the first via conductor may be formed from a continuous body constituted of a plurality of via elements, each via element being formed so as to pass through a corresponding one of the insulating layers between the outer electrode and the first wiring layer.

For example, when forming the first via conductor, a via hole is formed in the insulating layer using a laser beam, and the via hole has a tapered shape in which the diameter of the opening of the via hole in an end portion on the side irradiated by the laser beam is greater than an end portion on the other side. Accordingly, if an attempt is made to form the first via conductor so that an area of the end surface thereof on the stated other side has a desired size, the area of the end surface of the first via conductor on the one side thereof will increase as the insulating layer becomes thicker, which increases the overall volume of the first via conductor. In addition, push-up or push-down stress acting on the first in-plane conductor during pressure bonding/firing will increase as the overall volume of the first via conductor increases, and thus the risk of the first in-plane conductor separating from the insulating layer will increase as the insulating layer becomes thicker.

Accordingly, a plurality of insulating layers are disposed between the outer electrode and the first wiring layer (the first in-plane conductor), this plurality of insulating layers being thinner than the insulating layers aside from those between the outer electrode and the first wiring layer, and the first via conductor is formed from a continuous body constituted of a plurality of via elements, each via element being formed so as to pass through a corresponding one of these insulating layers. Accordingly, even when the area of the end surface of the first via conductor on the other end side thereof is the same, the overall volume of the first via conductor can be reduced as compared to the case where a single insulating layer is disposed between the outer electrode and the first wiring layer and the first via conductor is formed in that insulating layer. Reducing the overall volume of the first via conductor reduces the push-up or push-down stress acting on the first in-plane conductor from the first via conductor when pressure bonding/firing the multilayer body, which improves the effect of preventing the first in-plane conductor from separating from the insulating layer.

A plurality of the insulating layers may also be provided between the first wiring layer and the second wiring layer; each of the insulating layers between the first wiring layer and the second wiring layer may be thinner than the insulating layers between the outer electrode and the first wiring layer and the insulating layers aside from the insulating layers between the first wiring layer and the second wiring layer; and the second via conductor may be formed from a continuous body constituted of a plurality of via elements, each via element being formed so as to pass through a corresponding one of the insulating layers between the first wiring layer and the second wiring layer. Through this, the push-up or push-down stress acting on the first in-plane conductor from the second via conductor when pressure bonding/firing the multilayer body is reduced, which further improves the effect of preventing the first in-plane conductor from separating from the insulating layer.

In addition, the first via conductor may have a lower weight ratio of additives aside from a metal component than the second via conductor. When the weight ratio of additives aside from the metal component in the first via conductor is high, that via conductor experiences less thermal shrinkage rate, resulting in a greater difference in the amount of thermal shrinkage from the insulating layer when the multilayer body is pressure bonded/fired. In this case, the push-up or push-down stress acting on the first in-plane conductor from the first via conductor during the pressure bonding/firing increases, which in turn increases the risk of the first in-plane conductor separating from the insulating layer. Accordingly, making the weight ratio of additives aside from the metal component lower in the first via conductor located in the surface layer of the multilayer body, where there is greater influence on the separation of the first in-plane conductor, than in the second via conductor, reduces the push-up or push-down stress on the first in-plane conductor from the first via conductor, which improves the effect of preventing the first in-plane conductor from separating from the insulating layer.

In addition, of the plurality of via elements that form the first via conductor, a weight ratio of additives aside from a metal component of the via element directly connected to the outer electrode may be lower than a weight ratio of additives aside from a metal component of the other via element and the second via conductor. In this case as well, the push-up or push-down stress on the first in-plane conductor from the first via conductor is reduced as compared to a case where the first via conductor and the second via conductor have the same weight ratio of additives aside from the metal component, which improves the effect of preventing the first in-plane conductor from separating from the insulating layer.

In addition, the first in-plane conductor may be thinner than the second in-plane conductor. In this case, as like the line width of the first in-plane conductor is made narrower than that of the second in-plane conductor, the difference in the amount of thermal shrinkage between the first in-plane conductor and the insulating layer when pressure bonding/firing the multilayer body is reduced, which increases the strength of close contact between the first in-plane conductor and the insulating layer and makes it possible to reduce separation of the first in-plane conductor from the insulating layer.

In addition, the first via conductor may be formed having a tapered shape that narrows as the first via conductor progresses toward the first in-plane conductor, and the second via conductor may be formed having a tapered shape that narrows as the second via conductor progresses toward the first in-plane conductor. In this case, when pressure bonding/firing the multilayer body, the insulating layer functions as resistance to push-up or push-down stress from the first and second via conductors on the first in-plane conductor, and thus separation of the first in-plane conductor from the insulating layer can be reduced.

In addition, the above-described multilayer wiring board may be employed in a probe card. In this case, a highly-reliable probe card in which separation of the first in-plane conductor from the insulating layer is reduced can be provided.

According to the present disclosure, the first in-plane conductor connected to the other end of the first via conductor is formed so that the line width of the first in-plane conductor is narrower than the line width of the second in-plane conductor connected to the other end of the second via conductor. In other words, in a single wiring path connected to the outer electrode, the first in-plane conductor, which is the in-plane conductor closest to the outer electrode positioned on a surface of the multilayer body, is formed so that the line width of the first in-plane conductor is narrower than the line width of the second in-plane conductor disposed on a layer further inward than the first in-plane conductor.

The first and second in-plane conductors have different thermal shrinkage rates from the insulating layer, and thus a difference in the amount of thermal shrinkage between the in-plane conductors and the insulating layers when pressure bonding/firing the multilayer body increases as the line widths of the first and second in-plane conductors increase; this reduces the strength of close contact with the insulating layer. Accordingly, the line width of the first in-plane conductor, which is highly susceptible to push-up and push-down stress from the first via conductor and the second via conductor during pressure bonding/firing, is made narrower than the line width of the second in-plane conductor. Accordingly, the strength of close contact between the first in-plane conductor and the insulating layer can be increased as compared to a case where the first in-plane conductor and the second in-plane conductor are formed having the same line width, and thus it is more difficult for the first in-plane conductor to separate from the insulating layer when the first in-plane conductor receives push-up and push-down stress from the first via conductor and the second via conductor during pressure bonding/firing. In addition, reducing separation of the first in-plane conductor from the insulating layer improves the reliability of the multilayer wiring board.

BRIEF DESCRIPTION OF THE SEVERAL VIEWS OF THE DRAWINGS

FIG. 4 is a plan view of a first in-plane conductor in the multilayer wiring board according to the second embodiment of the present disclosure.

FIGS. 5A and 5B are diagrams illustrating variations on the first in-plane conductor indicated in FIG. 4.

DETAILED DESCRIPTION

<First Embodiment>

Figure 1:
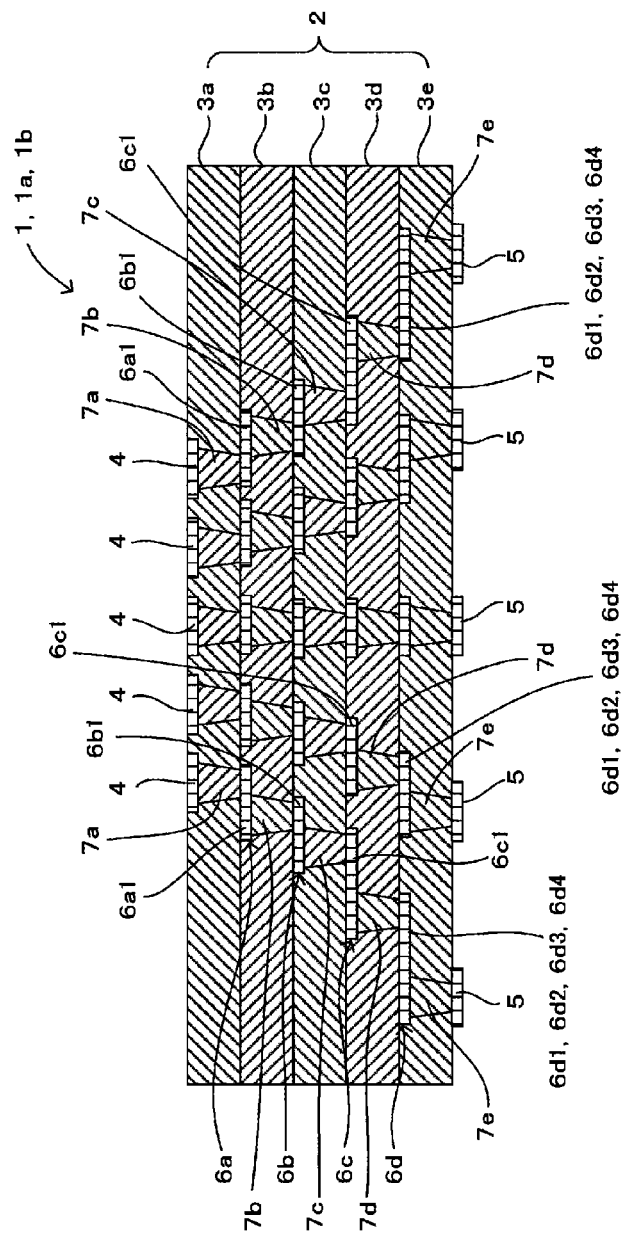
FIG. 1 is a cross-sectional view of a multilayer wiring board according to first to third embodiments of the present disclosure.
Figure 2:
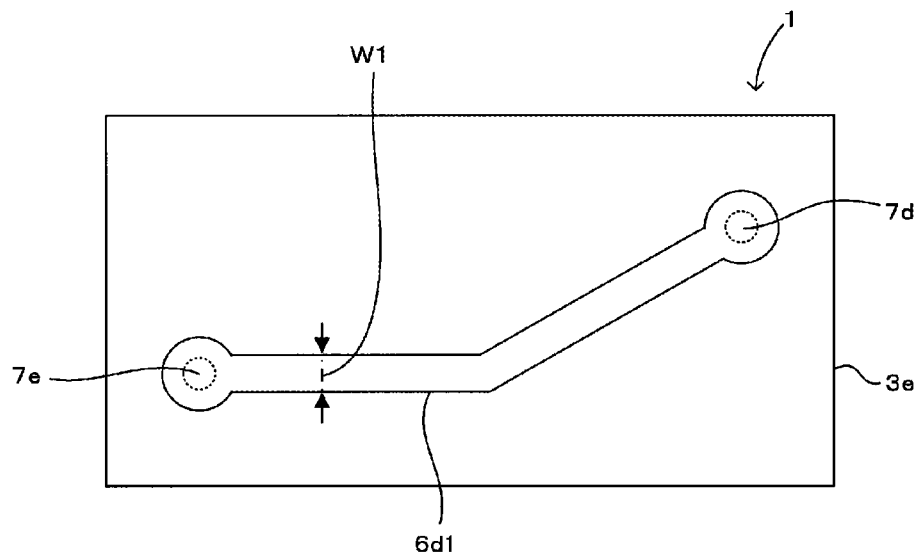
FIG. 2 is a plan view of a first in-plane conductor indicated in FIG. 1.
Figure 3:
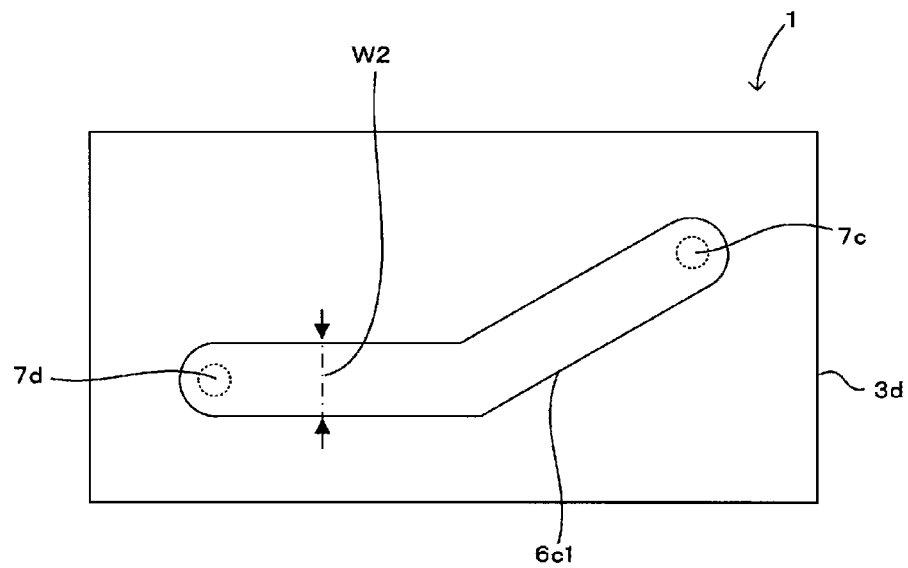
FIG. 3 is a plan view of a second in-plane conductor indicated in FIG. 1.

A multilayer wiring board 1 according to a first embodiment of the present disclosure will be described with reference to FIGS. 1 to 3. FIG. 1 is a cross-sectional view of the multilayer wiring board 1 according to the first embodiment of the present disclosure, FIG. 2 is a plan view of a first in-plane conductor 6d1 indicated in FIG. 1, and FIG. 3 is a plan view of a second in-plane conductor 6c1 indicated in FIG. 1.

As illustrated in FIG. 1, the multilayer wiring board 1 according to this embodiment includes a multilayer body 2 formed by laminating a plurality of insulating layers 3a to 3e together, a plurality of upper outer electrodes 4 formed on an upper surface of the multilayer body 2, a plurality of lower outer electrodes 5 formed on a lower surface of the multilayer body 2, and a plurality of wiring layers 6a to 6d disposed between adjacent insulating layers 3a to 3e. A plurality of via conductors 7a to 7e are provided in each of the insulating layers 3a to 3e, and corresponding upper outer electrodes 4 and lower outer electrodes 5 are connected with the via conductors 7a to 7e and the wiring layers 6a to 6d interposed therebetween.

Ceramics, a glass epoxy resin, or the like can be used as the material of which the insulating layers 3a to 3e are formed. In this embodiment, the insulating layers 3a to 3e are formed from low-temperature co-fired ceramics (LTCC). The number of the insulating layers 3a to 3e that constitute the multilayer body 2 can be increased or decreased as appropriate.

Each of the upper outer electrodes 4 is formed from one of Cu, Ag, and Al, and is connected to a probe pin, which is not illustrated in the drawings.

Each of the lower outer electrodes 5 is formed from one of Cu, Ag, and Al, and is connected to an external mounting board or the like using solder or the like.

The wiring layers 6a to 6d are constituted of a plurality of in-plane conductors 6a1, 6b1, 6c1, and 6d1, respectively, which are formed from one of Cu, Ag, and Al.

The via conductors 7a to 7e are formed by filling corresponding via holes formed so as to pass through predetermined insulating layers 3a to 3e with a conductive paste obtained by mixing, for example, one of Cu, Ag, and Al with an organic solvent or the like. These via holes are formed by irradiating the insulating layers 3a to 3e with a laser beam from one main surface side thereof. At this time, the via holes are formed having tapered shapes in which the diameter of the openings thereof decrease as the holes progress from the one main surface side to another main surface side of the insulating layers 3a to 3e.

According to the multilayer wiring board 1 configured in this manner, as described above, five signal paths are formed by the corresponding upper outer electrodes 4 and lower outer electrodes 5 being connected to each other with the in-plane conductors 6a1, 6b1, 6c1, and 6d1 and the via conductors 7a to 7e of the respective wiring layers 6a to 6d interposed therebetween. Meanwhile, the pitch of the via conductors 7a to 7e formed in the same one of the insulating layers 3a to 3e widens from an upper layer side to a lower layer side, and a rewiring structure is formed in the multilayer wiring board 1.

Here, a connection structure for each signal path will be described in detail using a signal path that connects the upper outer electrode 4 and the lower outer electrode 5 on the left end in FIG. 1 as an example. In this signal path, one end of the via conductor 7e (corresponding to a "first via conductor" according to the present disclosure; also called a first via conductor 7e hereinafter) formed in the insulating layer 3e that is the lowermost layer is connected to the lower outer electrode 5, and the in-plane conductor 6d1 (corresponding to a "first in-plane conductor" according to the present disclosure; also called the first in-plane conductor 6d1 hereinafter) in the wiring layer 6d of the lowermost layer is directly connected to another end of the first via conductor 7e. As illustrated in FIG. 2, the in-plane conductor 6d1 is formed in a line shape, and one end side thereof is connected to the first via conductor 7e.

Meanwhile, another end side of the in-plane conductor 6d1 is connected to one end of the via conductor 7d (corresponding to a "second via conductor" according to the present disclosure; also called a second via conductor 7d hereinafter) formed in the insulating layer 3d located on the opposite surface side from the surface where the in-plane conductor 6d1 and the first via conductor 7e connect. To rephrase, by being connected to the other end side of the in-plane conductor 6d1, the second via conductor 7d is provided in a location distanced from the first via conductor 7e by a predetermined distance in a direction orthogonal to a layering direction of the multilayer body 2.

Another end of the second via conductor 7d is connected to the in-plane conductor 6c1 (corresponding to a "second in-plane conductor" according to the present disclosure; also called the second in-plane conductor 6c1 hereinafter) of the wiring layer 6c one layer above the wiring layer 6d that is the lowermost layer. As illustrated in FIG. 3, this in-plane conductor 6c1 is also formed in a line shape, and one end thereof is connected to the other end of the second via conductor 7d. The in-plane conductors 6a1 and 6b1 and the via conductors 7a to 7c disposed above the in-plane conductor 6c1 are connected in the same manner, thus forming a single signal path that connects the upper outer electrode 4 and the lower outer electrode 5. The wiring layer 6d that is the lowermost layer corresponds to a "first wiring layer" according to the present disclosure, and the wiring layer 6c one layer thereabove corresponds to a "second wiring layer" according to the present disclosure.

In the case where a single signal path is formed by the in-plane conductors 6a1, 6b1, 6c1, and 6d1 and the via conductors 7a to 7e in this manner, it is common for the in-plane conductors 6a1, 6b1, 6c1, and 6d1 to be given the same line widths. However, in this embodiment, the in-plane conductor 6d1 in the wiring layer 6d closest to the lower surface of the multilayer body 2 is formed so that the line width thereof is narrower than the line widths of the other in-plane conductors 6a1, 6b1, and 6c1 in the single signal path.

For example, the second in-plane conductor 6c1 illustrated in FIG. 3 is formed so that a line width W2 thereof is 100 μm, whereas the first in-plane conductor 6d1 illustrated in FIG. 2 is formed so that a line width W1 thereof is 50 μm. The other in-plane conductors 6a1 and 6b1 are formed at the same 100 μm as the second in-plane conductor 6c1. Note that the stated values of the line widths W1 and W2 are examples, and can be changed as desired as long as the configuration is such that the first in-plane conductor 6d1 directly connected to the first via conductor 7e is formed so that the line width thereof is narrower than the line widths of the other in-plane conductors 6a1, 6b1, and 6c1 in the single signal path.

The upper outer electrode 4 and the lower outer electrode 5 are connected using substantially the same signal path connection structure as that described above in the other signal paths, aside from the signal path that connects the upper outer electrode 4 and the lower outer electrode 5 in the middle of FIG. 1.

(Method of Manufacturing Multilayer Wiring Board 1)

Next, a method of manufacturing the multilayer wiring board 1 according to this embodiment will be described. In this method of manufacturing the multilayer wiring board 1, first, the insulating layers 3a to 3e are individually prepared. Here, a plurality of ceramic green sheets that will form the insulating layers 3a to 3e are prepared, and the via holes are formed in predetermined positions of one main surface of each ceramic green sheet by irradiating those positions with a laser beam.

Next, the via conductors 7a to 7e are formed by using a printing technique or the like to fill the via holes that have been formed with a conductive paste containing, for example, one metal of Cu, Ag, or Al, an organic solvent, and the like.

Next, the insulating layers 3a to 3e are completed by forming the in-plane conductors 6a1, 6b1, 6c1, and 6d1 that constitute the wiring layers 6a to 6d in predetermined positions on the one main surface or another main surface of the respective ceramic green sheets. At this time, the in-plane conductor 6d1 in the wiring layer 6d that is the lowermost layer is formed so that the line width W1 is narrower than the line widths of the in-plane conductors 6a1, 6b1, and 6c1 in the other insulating layers 6a to 6c.

In addition, the upper outer electrodes 4 are formed in predetermined positions of the ceramic green sheet that forms the upper surface of the multilayer body 2, and the lower outer electrodes 5 are formed in predetermined positions of the ceramic green sheet that forms the lower surface of the multilayer body 2. The in-plane conductors 6a1, 6b1, 6c1, and 6d1, the upper outer electrodes 4, and the lower outer electrodes 5 can be formed through a printing technique that uses a conductive paste containing, for example, one metal of Cu, Ag, and Al.

Next, the prepared insulating layers 3a to 3e are stacked in a predetermined order and then pressure bonded, thus forming the multilayer body 2 in which the insulating layers 3a to 3e are laminated together.

Finally, the multilayer wiring board 1 is completed by firing the multilayer body 2 at a predetermined temperature (850° C., for example) in this pressurized state.

Note that when preparing the insulating layers 3a to 3e, a weight ratio of additives aside from the metal component in the first via conductor 7e formed in the insulating layer 3e that is the lowermost layer may be set to be lower than the corresponding weight ratios of the other via conductors 7a to 7d, including the second via conductor 7d. When the weight ratio of additives aside from the metal component in the first via conductor 7e is high, that via conductor experiences less thermal shrinkage rate, resulting in a greater difference in the amount of thermal shrinkage from the insulating layers 3a to 3e when the multilayer body 2 is pressure bonded/fired. This causes a greater amount of push-up stress to act on the first in-plane conductor 6d1 from the first via conductor 7e during the pressure bonding/firing, which increases the risk of the first in-plane conductor 6d1 separating from the insulating layer 3e. Accordingly, making the weight ratio of additives aside from the metal component lower in the first via conductor 7e located in the lowermost layer of the multilayer body 2, where there is greater influence on the separation of the first in-plane conductor 6d1, than in the other via conductors 7a to 7d, improves the effect of preventing the first in-plane conductor 6d1 from separating from the insulating layer 3e.

A probe card according to the present disclosure includes the above-described multilayer wiring board 1 and a plurality of probe pins connected to corresponding upper outer electrodes 4 formed in the upper surface of the multilayer body 2. This makes it possible to carry out electrical inspections of semiconductor devices and the like in which signal terminals are disposed at high densities.

As such, according to the above-described embodiment, in a single signal path that connects a predetermined upper outer electrode 4 and a predetermined lower outer electrode 5, the first in-plane conductor 6d1, which is the in-plane conductor closest to the lower outer electrode 5 located on the surface (lower surface) of the multilayer body 2, is formed so that the line width W1 thereof is narrower than the line width of the second in-plane conductor 6c1 disposed in a layer further inward than the first in-plane conductor 6d1.

The in-plane conductors 6a1, 6b1, 6c1, and 6d1 have different thermal shrinkage rates from the insulating layers 3a to 3e, and thus as the line widths W1 and W2 of the in-plane conductors 6a1, 6b1, 6c1, and 6d1 increase, the difference in amount of thermal shrinkage between the in-plane conductors 6a1, 6b1, 6c1, and 6d1 and the insulating layers 3a to 3e when the multilayer body 2 is pressure bonded/fired increases, causing a drop in the strength of close contact with the insulating layers 3a to 3e.

Accordingly, the line width W1 of the first in-plane conductor 6d1, which is highly susceptible to push-up and push-down stress from the first via conductor 7e and the second via conductor 7d during pressure bonding/firing, is made narrower than the line width of the second in-plane conductor 6c1. Through this, the strength of close contact between the first in-plane conductor 6d1 and the insulating layers 3d and 3e can be increased as compared to a case where the in-plane conductors 6a1, 6b1, 6c1, and 6d1 are formed at the same line widths in a single signal path, which makes it possible to reduce separation of the first in-plane conductor 6d1 from the insulating layers 3d and 3e when pressure bonding/firing the multilayer body 2. Reducing separation of the first in-plane conductor 6d1 from the insulating layers 3d and 3e improves the reliability of the multilayer wiring board 1.

<Second Embodiment>

A multilayer wiring board 1a according to a second embodiment of the present disclosure will be described with reference to FIGS. 1 and 4. FIG. 4 is a plan view of a first in-plane conductor 6d2 provided in the multilayer wiring board 1a, and is a diagram corresponding to FIG. 2 referred to in the descriptions of the multilayer wiring board 1 according to the first embodiment.

The multilayer wiring board 1a according to this embodiment differs from the multilayer wiring board 1 according to the first embodiment described with reference to FIGS. 1 to 3 in that, as illustrated in FIG. 4, the first in-plane conductor 6d2 connected to the lower outer electrode 5 with the first via conductor 7e interposed therebetween is provided with a slit 10a that passes through the first in-plane conductor 6d2 in a thickness direction thereof. The rest of the configuration is the same as that of the multilayer wiring board 1 according to the first embodiment, and descriptions thereof will be omitted by using the same reference numerals.

In this case, the slit 10a is provided in the first in-plane conductor 6d2 that is highly susceptible to push-up and push-down stress from the first via conductor 7e and the second via conductor 7d, in substantially the center of a line width direction of the first in-plane conductor 6d2 and following a length direction of the line.

Through this, when pressure bonding/firing the multilayer body 2, the insulating layers 3d and 3e just above and below the first in-plane conductor 6d2 enter into the slit 10a and form a column, and the column of the insulating layers 3d and 3e alleviates the push-up and push-down stress from the first via conductor 7e and the second via conductor 7d on the first in-plane conductor 6d2. The effect of reducing separation of the first in-plane conductor 6d2 from the insulating layers 3d and 3e is further improved as a result. Furthermore, providing the slit 10a increases the surface area of the first in-plane conductor 6d2 per unit length thereof, which improves high-frequency characteristics in the case where a high-frequency signal is used.

(Variations on First In-plane Conductor 6d2)

Variations on the first in-plane conductor 6d2 of the multilayer wiring board 1a according to this embodiment will be described with reference to FIGS. 5A and 5B. FIGS. 5A and 5B are diagrams illustrating variations on the first in-plane conductor 6d2, and are diagrams corresponding to FIG. 4.

The shape of the slit provided in the first in-plane conductor 6d2 can be changed as desired. For example, as indicated by the variations on the in-plane conductor 6d2 illustrated in FIG. 5A, a plurality of slits 10b, each having a rectangular shape when viewed in plan view, may be provided in a row following the length direction of the first in-plane conductor 6d2. Alternatively, as illustrated in FIG. 5B, a plurality of slits 10c, each having a rhombus shape, may be provided in a row following the length direction of the first in-plane conductor 6d2. The same effects as the multilayer wiring board 1a according to the second embodiment can be achieved by this configuration as well.

<Third Embodiment>

Figure 6:
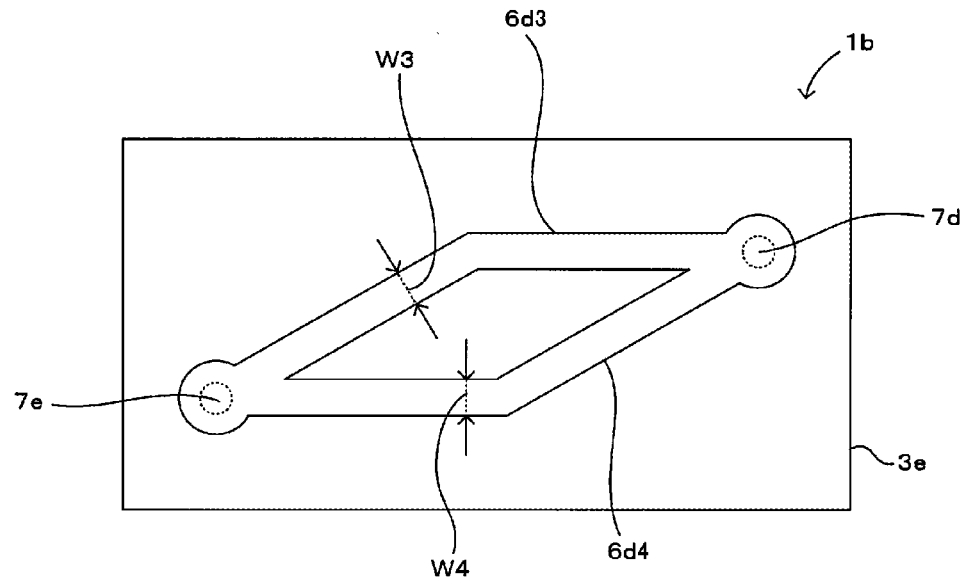
FIG. 6 is a plan view of a first in-plane conductor in the multilayer wiring board according to the third embodiment of the present disclosure.

A multilayer wiring board 1b according to a third embodiment of the present disclosure will be described with reference to FIGS. 1 and 6. FIG. 6 is a plan view of first in-plane conductors 6d3 and 6d4 provided in the multilayer wiring board 1b, and is a diagram corresponding to FIG. 2 referred to in the descriptions of the multilayer wiring board 1 according to the first embodiment.

The multilayer wiring board 1b according to this embodiment differs from the multilayer wiring board 1 according to the first embodiment described with reference to FIGS. 1 to 3 in that, as illustrated in FIGS. 1 and 6, a plurality of (two, in this embodiment) first in-plane conductors 6d3 and 6d4 are provided in the wiring layer 6d that is the lowermost layer, in a single signal path connecting a corresponding upper outer electrode 4 and lower outer electrode 5. The rest of the configuration is the same as that of the multilayer wiring board 1 according to the first embodiment, and descriptions thereof will be omitted by using the same reference numerals.

In this case, as illustrated in FIG. 6, of the signal path connecting the corresponding upper outer electrode 4 and lower outer electrode 5, the first in-plane conductors 6d3 and 6d4 provided in the wiring layer 6d that is the lowermost layer are formed so that respective line widths W3 and W4 thereof are narrower than the line width W2 of the second in-plane conductor 6c1 (see FIG. 3) (that is, W2>W3, W4). In addition, the first via conductor 7e and the second via conductor 7d are connected in parallel by the first in-plane conductors 6d3 and 6d4.

In this manner, separation of the first in-plane conductors 6d3 and 6d4 from the insulating layers 3d and 3e can be reduced even when the line widths W3 and W4 of the first in-plane conductors 6d3 and 6d4 are narrower than the line width of the second in-plane conductor 6c1. Furthermore, the insulating layers 3d and 3e form a column between the first in-plane conductors 6d3 and 6d4 when the multilayer body 2 is pressure bonded/fired, and thus the effect of reducing separation of the first in-plane conductors 6d3 and 6d4 from the insulating layers 3d and 3e is further improved for the same reason as with the multilayer wiring board 1a according to the second embodiment.

In addition, by connecting the first and second via conductors 7e and 7d in parallel using the first in-plane conductors 6d3 and 6d4, high currents can be handled while reducing separation of the first in-plane conductors 6d3 and 6d4 from the insulating layers 3d and 3e. To make it easier to handle high currents, a sum of the line widths W3 and W4 of the first in-plane conductors 6d3 and 6d4 may be made greater than the line width W2 of the second in-plane conductor 6c1 (W3+W4>W2).

(Variation on First In-plane Conductors 6d3 and 6d4)

Figure 7:
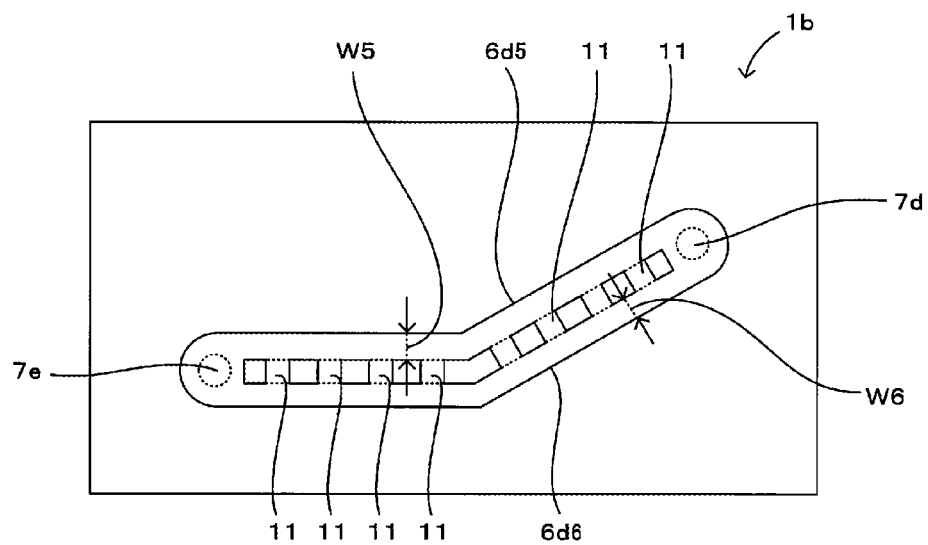
FIG. 7 is a diagram illustrating a variation on the first in-plane conductor indicated in FIG. 6.

A variation on the first in-plane conductors 6d3 and 6d4 according to this embodiment will be described with reference to FIG. 7. FIG. 7 is a diagram illustrating a variation on the first in-plane conductors 6d3 and 6d4, and corresponds to FIG. 6.

In this case, as illustrated in FIG. 7, first in-plane conductors 6d5 and 6d6 that connect the first via conductor 7e and the second via conductor 7d in parallel are disposed parallel to each other with a predetermined gap therebetween. The first in-plane conductors 6d5 and 6d6 are formed so that respective line widths W5 and W6 thereof are narrower than the line width W2 of the second in-plane conductor 6c1 (see FIG. 3). Meanwhile, a plurality of linking portions 11 are provided between the first in-plane conductors 6d5 and 6d6, resulting in a structure in which the first in-plane conductors 6d5 and 6d6 are linked by the linking portions 11 throughout a path connecting the first via conductor 7e and the second via conductor 7d. This results in the same type of structure as that illustrated in FIG. 3, in which slits are provided in the second in-plane conductor 6c1 having the line width W2.

Incidentally, although forming the first in-plane conductor 6d1 provided in the multilayer wiring board 1 according to the above-described first embodiment so that the line width W1 thereof narrower than the line widths of the other in-plane conductors 6a1, 6b1, and 6c1 including the second in-plane conductor 6c1 does reduce separation from the insulating layers 3d and 3e compared to a case where the line widths are the same in the in-plane conductors 6a1, 6b1, 6c1, and 6d1, doing so also makes it more difficult to handle high currents. However, employing a wiring structure such as that according to this variation makes it possible to ensure similar current resistance characteristics as in the case where the in-plane conductors 6a1, 6b1, 6c1, and 6d1 have equal line widths.

Furthermore, the insulating layers 3d and 3e form columns in the gaps (slits) between the first in-plane conductors 6d5 and 6d6 when the multilayer body 2 is pressure bonded/fired, and thus separation of the first in-plane conductors 6d5 and 6d6 from the insulating layers 3d and 3e can be reduced for the same reason as with the multilayer wiring board 1a according to the second embodiment.

<Fourth Embodiment>

Figure 8:
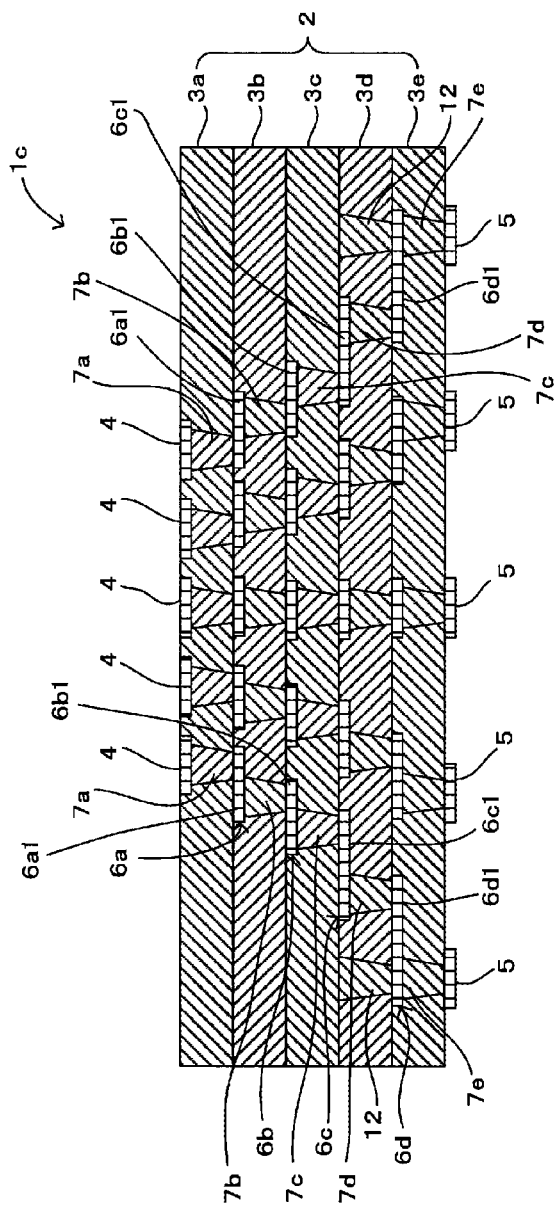
FIG. 8 is a cross-sectional view of a multilayer wiring board according to a fourth embodiment of the present disclosure.

A multilayer wiring board 1c according to a fourth embodiment of the present disclosure will be described with reference to FIG. 8. FIG. 8 is a cross-sectional view of the multilayer wiring board 1c.

The multilayer wiring board 1c according to this embodiment differs from the multilayer wiring board 1 according to the first embodiment described with reference to FIGS. 1 to 3 in that, as illustrated in FIG. 8, dummy via conductors 12 are provided in positions on the opposite sides of the surfaces of the first in-plane conductor 6d1 that connect with the corresponding first via conductors 7e, so as to overlap with the first via conductors 7e when viewed in plan view.

The rest of the configuration is the same as that of the multilayer wiring board 1 according to the first embodiment, and descriptions thereof will be omitted by using the same reference numerals.

In this case, the dummy via conductors 12 are provided in positions that overlap with the first via conductors 7e connected to the first in-plane conductor 6d1 when viewed in plan view, and the dummy via conductors 12 are connected to a surface of the first in-plane conductor 6d1 on the opposite side as the surface of the first in-plane conductor 6d1 connected to the first via conductors 7e.

Through this, push-up stress acting on the first in-plane conductor 6d1 from the first via conductors 7e when pressure bonding/firing the multilayer body 2 is canceled out by push-down stress acting on the first in-plane conductor 6d1 from the dummy via conductors 12. In other words, stress received by the first in-plane conductor 6d1 from the first via conductors 7e when pressure bonding/firing the multilayer body 2 is reduced, which reduces separation of the first in-plane conductor 6d1 from the insulating layers 3d and 3e. Note that the dummy via conductors 12 need not be connected to the surface of the first in-plane conductor 6d1 on the opposite side from the surface of the first in-plane conductor 6d1 connected to the first via conductors 7e, and the configuration may be such that the dummy via conductors 12 are disposed in positions, on the upper layer side of the first in-plane conductor 6d1, that overlap with the first via conductors 7e when viewed in plan view, in the layering direction of the multilayer body 2.

<Fifth Embodiment>

Figure 9:
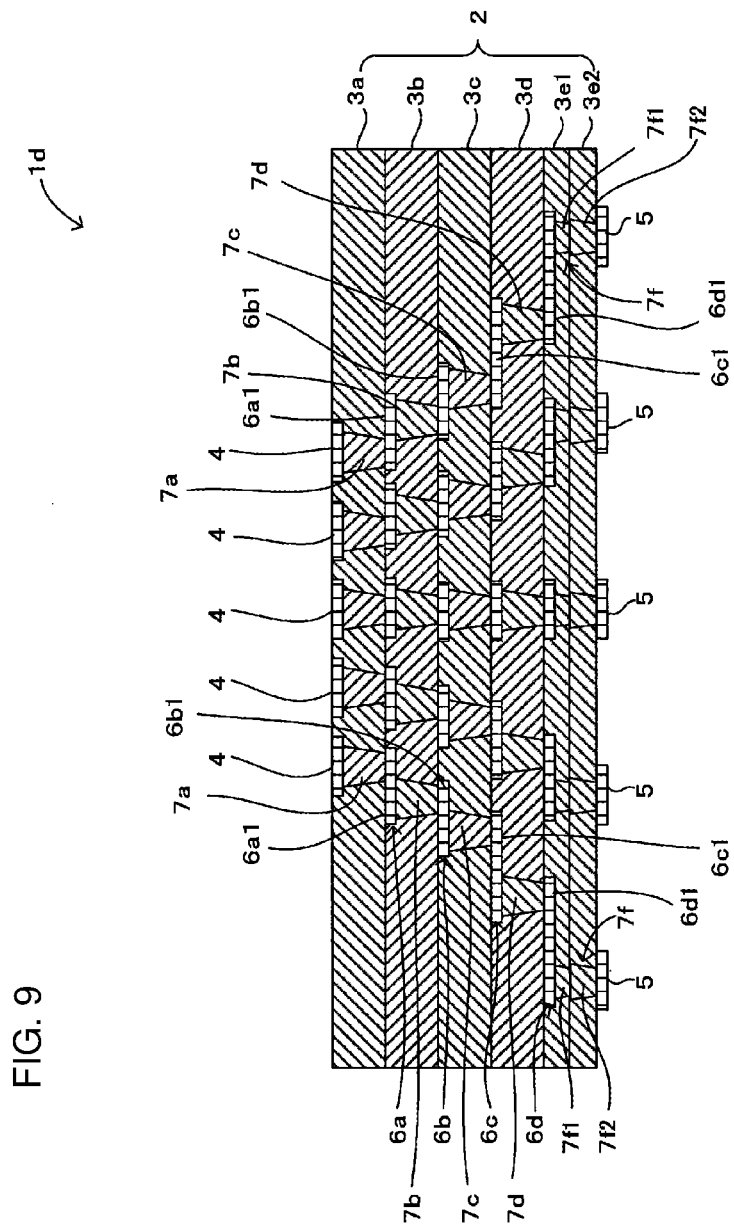
FIG. 9 is a cross-sectional view of a multilayer wiring board according to a fifth embodiment of the present disclosure.

A multilayer wiring board 1d according to a fifth embodiment of the present disclosure will be described with reference to FIG. 9. FIG. 9 is a cross-sectional view of the multilayer wiring board 1d.

The multilayer wiring board 1d according to this embodiment differs from the multilayer wiring board 1 according to the first embodiment described with reference to FIGS. 1 to 3 in that, as illustrated in FIG. 9, a plurality of (two, in this embodiment) insulating layers 3e1 and 3e2 are disposed between the lower outer electrodes 5 and the wiring layer 6d that is the lowermost layer, and first via conductors 7f are each formed as continuous bodies constituted of two via elements 7f1 and 7f2 formed so as to pass through the insulating layers 3e1 and 3e2, respectively. The rest of the configuration is the same as that of the multilayer wiring board 1 according to the first embodiment, and descriptions thereof will be omitted by using the same reference numerals.

In this case, the insulating layers 3e1 and 3e2 between the lower outer electrodes 5 and the wiring layer 6d are each formed so as to be thinner than the other insulating layers 3a to 3d. In the process of manufacturing the multilayer wiring board 1d, the via elements 7f1 and 7f2 are prepared individually in the insulating layers 3e1 and 3e2, respectively, and the first via conductors 7f that form the continuous bodies constituted of the via elements 7f1 and 7f2 are formed through the stacking, pressure bonding, and firing of the insulating layers 3a to 3d, 3e1, and 3e2.

Incidentally, in the structure of the multilayer wiring board 1 according to the first embodiment, via holes are formed in the insulating layer 3e using a laser beam when forming the first via conductors 7e, and the via holes have tapered shapes in which the diameter of the opening of each via hole in the end portion on the side irradiated by the laser beam is greater than the end portion on the other side. Accordingly, if an attempt is made to form the first via conductors 7e so that an area of the end surfaces thereof on the stated other side has a desired size, the areas of the end surfaces of the first via conductors 7e on the one side thereof will increase as the insulating layer 3e becomes thicker, which increases the overall volume of the first via conductors 7e. In addition, the push-up stress acting on the first in-plane conductor 6d1 during pressure bonding/firing will increase as the overall volume of the first via conductors 7e increases, and thus the risk of the first in-plane conductor 6d1 separating from the insulating layers 3d and 3e will increase as the insulating layer 3e becomes thicker.

Accordingly, the insulating layers 3e1 and 3e2, which are thinner than the insulating layers 3a to 3d that are not located between the lower outer electrodes 5 and the first in-plane conductor 6d1, are disposed between the lower outer electrodes 5 and the first in-plane conductor 6d1, and the first via conductors 7f are formed as continuous bodies constituted by the two via elements 7f1 and 7f2 formed so as to pass through the insulating layers 3e1 and 3e2, respectively.

Accordingly, even when the area of the end surfaces of the first via conductors 7f on the other end sides thereof are the same, the overall volume of the first via conductors 7f can be reduced as compared to the multilayer wiring board 1 according to the first embodiment, in which the single insulating layer 3e is disposed between the lower outer electrodes 5 and the first in-plane conductor 6d1 and the first via conductors 7e are formed in the insulating layer 3e. Reducing the overall volume of the first via conductors 7f reduces the push-up stress acting on the first in-plane conductor 6d1 from the first via conductors 7f when pressure bonding/firing the multilayer body 2, and thus separation of the first in-plane conductor 6d1 from the insulating layers 3d and 3e1 can be reduced. Furthermore, reducing the overall volume of the first via conductors 7f also reduces the push-down stress acting on the lower outer electrodes 5 from the first via conductors 7f when pressure bonding/firing the multilayer body 2, which improves the flatness of the lower surface of the multilayer body 2.

In this embodiment, a weight ratio of additives aside from a metal component in the one via element 7f2 that, of the via elements 7f1 and 7f2 forming the first via conductors 7f, is directly connected to the lower outer electrode 5 may be made lower than a weight ratio of additives aside from a metal component in the other via element 7f1 and the via conductors 7a to 7d aside from the first via conductors 7f. Through this, when pressure bonding/firing the multilayer body, push-up stress acting on the first in-plane conductor 6d1 from the first via conductors 7f including the via elements 7f2 decreases as a difference in the amount of thermal shrinkage between the via elements 7f2, which have a low weight ratio of additives aside from the metal component, and the insulating layers 3a to 3e decreases, and thus the effect of preventing the first in-plane conductor 6d1 from separating from the insulating layers 3d and 3e is improved.

<Sixth Embodiment>

Figure 10:
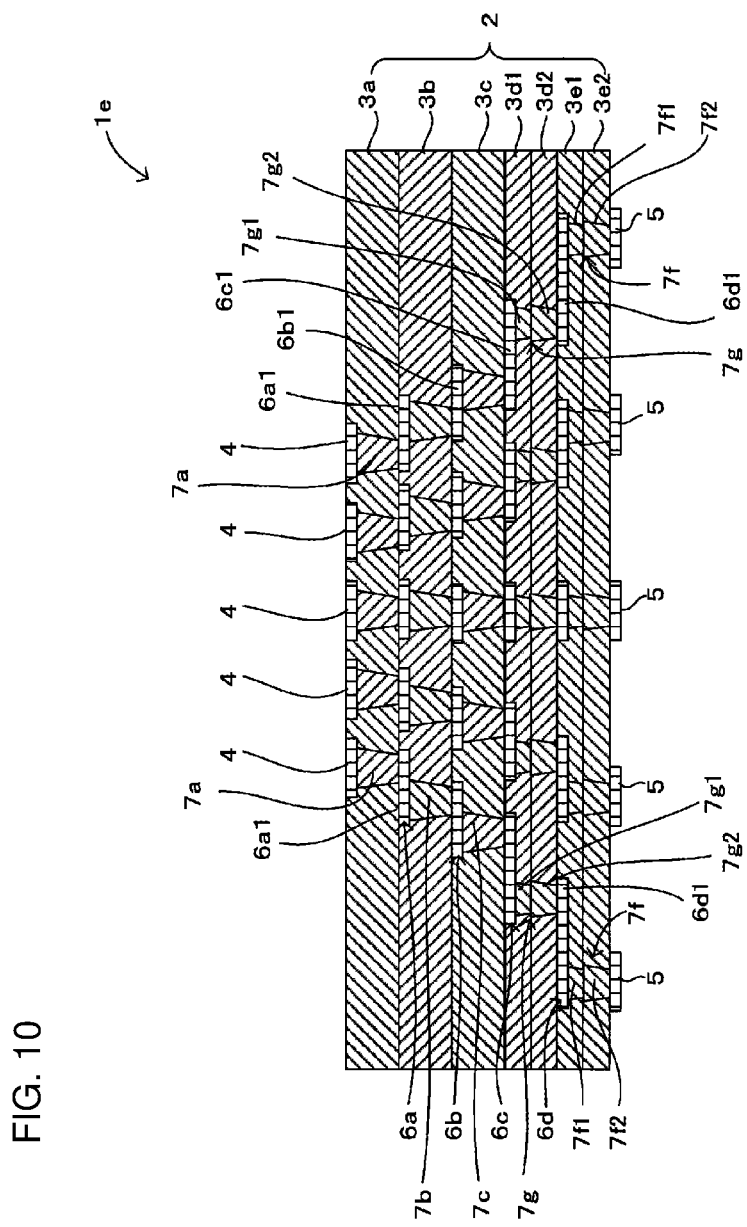
FIG. 10 is a cross-sectional view of a multilayer wiring board according to a sixth embodiment of the present disclosure.

A multilayer wiring board 1e according to a sixth embodiment of the present disclosure will be described with reference to FIG. 10. FIG. 10 is a cross-sectional view of the multilayer wiring board 1e.

The multilayer wiring board 1e according to this embodiment differs from the multilayer wiring board 1d according to the fifth embodiment described with reference to FIG. 9 in that, as illustrated in FIG. 10, second via conductors 7g are formed from continuous bodies constituted of two via elements 7g1 and 7g2, in the same manner as the first via conductors 7f. The rest of the configuration is the same as that of the multilayer wiring board 1d according to the fifth embodiment, and descriptions thereof will be omitted by using the same reference numerals.

In this case, a plurality of (two, in this embodiment) insulating layers 3d1 and 3d2 are disposed between the first in-plane conductor 6d1 and the second in-plane conductor 6c1 as well. Here, the insulating layers 3d1 and 3d2 are formed thinner than the other insulating layers 3a to 3c aside from the insulating layers 3e1 and 3e2 between the lower outer electrodes 5 and the first in-plane conductor 6d1, and the second via conductors 7g are formed as continuous bodies constituted of the two via elements 7g1 and 7g2 formed in the insulating layers 3d1 and 3d2, respectively.

Through this, the push-down stress acting on the first in-plane conductor 6d1 from the second via conductors 7g when the multilayer body 2 is pressure bonded/fired can be reduced for the same reasons as in the multilayer wiring board 1d according to the fifth embodiment. In other words, according to this embodiment, the push-up and push-down stresses from the first and second via conductors 7f and 7g, respectively, on the first in-plane conductor 6d1 can be reduced, which further improves the effect of suppressing the first in-plane conductor 6d1 from separating from the insulating layers 3d2 and 3e1.

Note that in this embodiment, it is not absolutely necessary that the first via conductors 7f be formed from continuous bodies constituted by the plurality of via elements 7f1 and 7f2.

<Seventh Embodiment>

Figure 11:
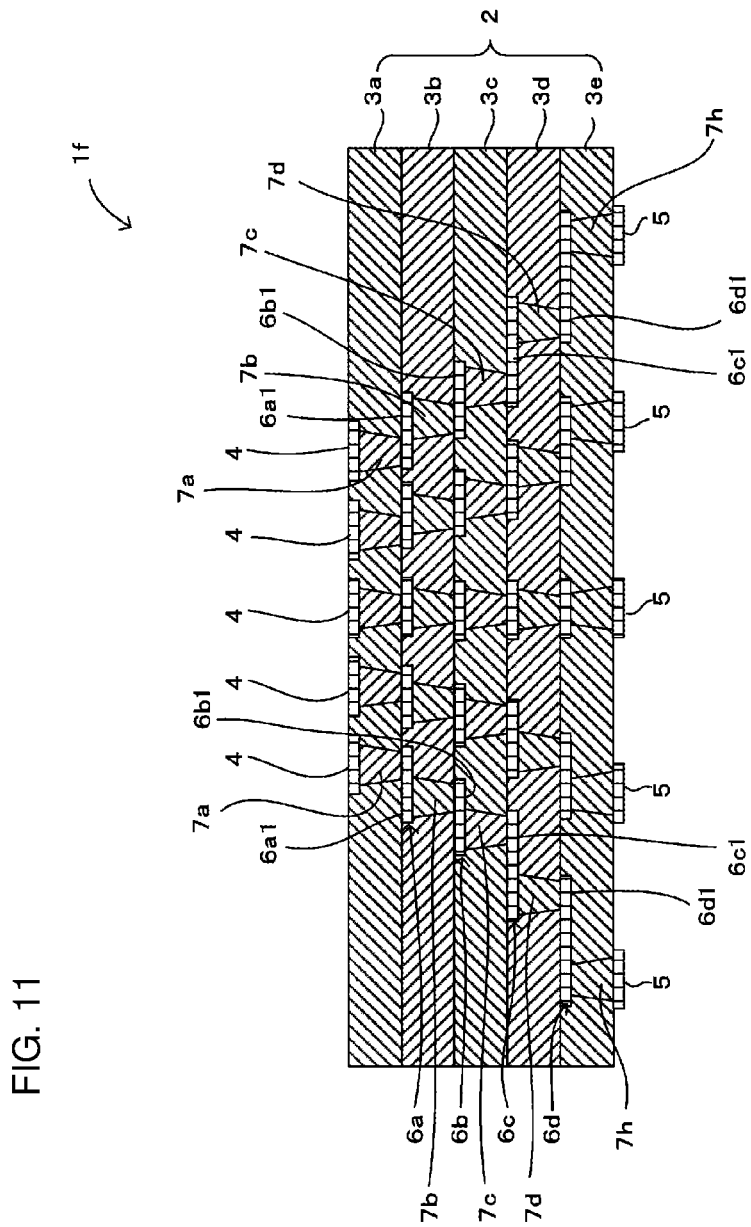
FIG. 11 is a cross-sectional view of a multilayer wiring board according to a seventh embodiment of the present disclosure.

A multilayer wiring board 1f according to a seventh embodiment of the present disclosure will be described with reference to FIG. 11. FIG. 11 is a cross-sectional view of the multilayer wiring board 1f.

The multilayer wiring board 1f according to this embodiment differs from the multilayer wiring board 1 according to the first embodiment described with reference to FIGS. 1 to 3 in that, as illustrated in FIG. 11, first via conductors 7h have different shapes. The rest of the configuration is the same as that of the multilayer wiring board 1 according to the first embodiment, and descriptions thereof will be omitted by using the same reference numerals.

In this case, while the first via conductors 7e of the multilayer wiring board 1 according to the first embodiment are formed having tapered shapes that narrow as the via conductors progress away from the first in-plane conductor 6d1, the first via conductors 7h of the multilayer wiring board 1f according to this embodiment are formed having tapered shapes that narrow as the via conductors progress toward the first in-plane conductor 6d1. Meanwhile, the second via conductors 7d are formed having tapered shapes that narrow as the via conductors progress toward the first in-plane conductor 6d1.

By forming the first and second via conductors 7h and 7d in this manner, when pressure bonding/firing the multilayer body 2, the insulating layer 3e covering the peripheries of the first via conductors 7h functions as resistance to push-up stress from the first via conductors 7h on the first in-plane conductor 6d1, and the insulating layer 3d covering the peripheries of the second via conductors 7d functions as resistance to push-down stress from the second via conductors 7d on the first in-plane conductor 6d1. In this case, the push-up and push-down stress from the first and second via conductors 7h and 7d, respectively, on the first in-plane conductor 6d1 is alleviated, which makes it possible to reduce separation of the first in-plane conductor 6d1 from the insulating layers 3d and 3e.

<Eighth Embodiment>

Figure 12:
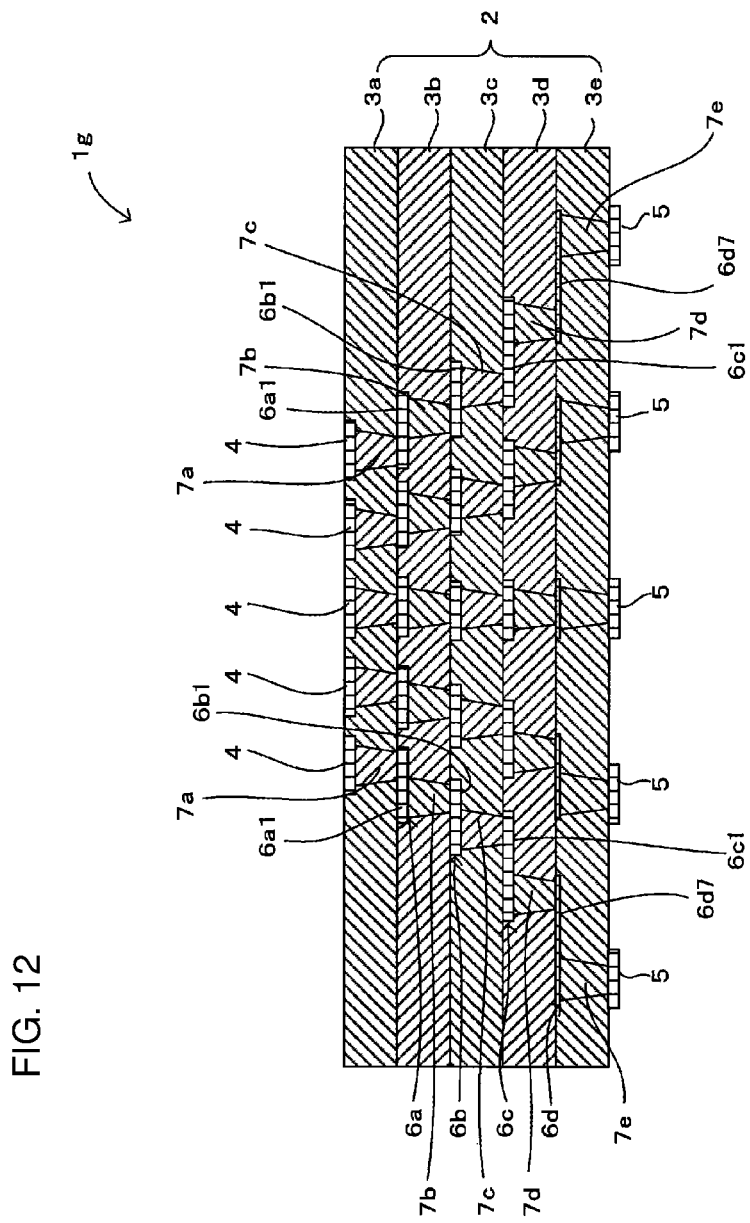
FIG. 12 is a cross-sectional view of a multilayer wiring board according to an eighth embodiment of the present disclosure.
Figure 13:
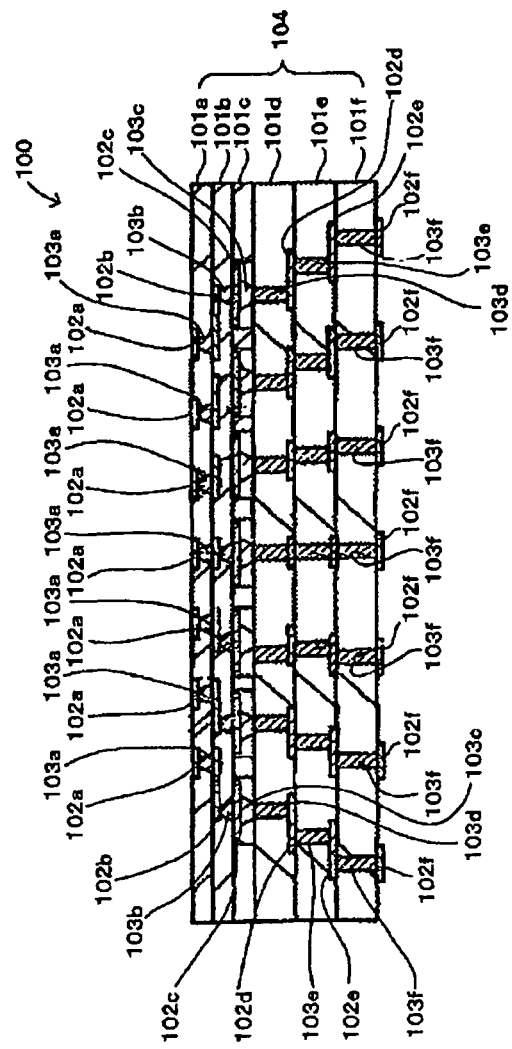
FIG. 13 is a cross-sectional view of a conventional multilayer wiring board.

A multilayer wiring board 1g according to an eighth embodiment of the present disclosure will be described with reference to FIG. 12. FIG. 12 is a cross-sectional view of the multilayer wiring board 1g.

The multilayer wiring board 1g according to this embodiment differs from the multilayer wiring board 1 according to the first embodiment described with reference to FIGS. 1 to 3 in that, as illustrated in FIG. 12, of in-plane conductors 6a1, 6b1, 6c1, and 6d7 that form a single signal path connecting a corresponding upper outer electrode 4 and lower outer electrode 5, the first in-plane conductor 6d7 formed in the wiring layer 6d that is the lowermost layer is formed so as to be thinner than the other in-plane conductors 6a1, 6b1, and 6c1 including the second in-plane conductor 6c1. The rest of the configuration is the same as that of the multilayer wiring board 1 according to the first embodiment, and descriptions thereof will be omitted by using the same reference numerals.

In this case, in the same manner as when the line width W1 of the first in-plane conductor 6d7 is narrower than the line width of the second in-plane conductor 6c1, a difference in the amount of thermal shrinkage between the first in-plane conductor 6d7 and the insulating layers 3a to 3e when pressure bonding/firing the multilayer body 2 decreases; this increases the strength of close contact between the first in-plane conductor 6d7 and the insulating layers 3d and 3e, which makes it possible to reduce separation of the first in-plane conductor 6d7 from the insulating layers 3d and 3e.

Note that the present disclosure is not intended to be limited to the above-described embodiments, and many changes aside from the content described above can be made without departing from the essential spirit of the present disclosure. For example, a multilayer wiring board may be formed by combining the configurations described in the respective embodiments.

In addition, although the above embodiments describe cases of reducing separation of the first in-plane conductor 6d1 in the wiring layer 6d that is the lowermost layer from the insulating layers 3d and 3e, there is also a risk of the in-plane conductor 6a1 in the wiring layer 6a closest to the upper surface of the multilayer body 2 separating from the insulating layers 3a and 3b under the push-up and push-down stress from the via conductors 7a and 7b connected thereto when pressure bonding/firing the multilayer body 2, as compared to the in-plane conductors 6b1 and 6c1 in the inner layers. As such, the disclosures according to the above-described embodiments may also be applied in the in-plane conductor 6a1 on the upper layer side.

Furthermore, the multilayer wiring boards 1, 1a, 1b, 1c, 1d, 1e, 1f, and 1g according to the above-described embodiments are not limited to probe cards, and can be used as boards for matching circuit modules, for example.

INDUSTRIAL APPLICABILITY

The present disclosure can be applied in a variety of multilayer wiring boards that include in-plane conductors and via conductors therein.

REFERENCE SIGNS LIST 1, 1a, 1b, 1c, 1d, 1e, 1f MULTILAYER WIRING BOARD
2 MULTILAYER BODY
3a, 3b, 3c, 3d, 3d1, 3d2, 3e, 3e1, 3e2 INSULATING LAYER
5 LOWER OUTER ELECTRODE

6d1, 6d2, 6d3, 6d4, 6d5, 6d6, 6d7 FIRST IN-PLANE CONDUCTOR
6c1 SECOND IN-PLANE CONDUCTOR
7e, 7f, 7h FIRST VIA CONDUCTOR
7d, 7g SECOND VIA CONDUCTOR
7f1, 7f2, 7g1, 7g2 VIA ELEMENT
10a, 10b, 10c SLIT
12 DUMMY VIA CONDUCTOR

The invention claimed is:

1. A multilayer wiring board comprising:
a multilayer body comprising a plurality of insulating layers laminated together;
a first outer electrode located on a first main outermost surface of the multilayer body;
a second outer electrode located on a second main outermost surface of the multilayer body that is opposite from the first main outermost surface of the multilayer body;
a first via conductor provided within the multilayer body and connected at one end to the first outer electrode;
a first wiring layer including a line-shaped first in-plane conductor directly connected to another end of the first via conductor;
a second via conductor provided within the multilayer body on a surface of the first in-plane conductor on the opposite side from a surface of the first in-plane conductor connected to the first via conductor, in a position distanced from the first via conductor by a predetermined distance in a direction orthogonal to a layering direction of the multilayer body, one end of the second via conductor being connected to the first in-plane conductor;
a second wiring layer including a line-shaped second in-plane conductor connected to another end of the second via conductor;
a third via conductor provided within the multilayer body on a surface of the second in-plane conductor on the opposite side from a surface of the second in-plane conductor connected to the second via conductor, in a position distanced from the second via conductor by a predetermined distance in a direction orthogonal to a layering direction of the multilayer body, one end of the third via conductor being connected to the second in-plane conductor;
a fourth via conductor provided within the multilayer body and connected at one end to the second outer electrode;
a third wiring layer including a third line-shaped portion of a third in-plane conductor directly connected to another end of the fourth via conductor; and
a fifth via conductor provided within the multilayer body on a surface of the third in-plane conductor on the opposite side from a surface of the third in-plane conductor connected to the fourth via conductor, in a position distanced from the fourth via conductor by a predetermined distance in a direction orthogonal to a layering direction of the multilayer body, one end of the fifth via conductor being connected to the third in-plane conductor,
wherein the first in-plane conductor comprises a first portion that is in contact with the first via conductor and disposed immediately above the first via conductor, a second portion that is in contact with the second via conductor and disposed immediately below the second via conductor, and a first line-shaped portion connecting the first portion and the second portion,
the second in-plane conductor comprises a third portion that is in contact with the second via conductor and disposed immediately above the second via conductor, a fourth portion that is in contact with the third via conductor and disposed immediately below the third via conductor, and a second line-shaped portion connecting the third portion and the fourth portion,
the third in-plane conductor comprises a fifth portion that is in contact with the fourth via conductor and disposed immediately below the fourth via conductor, a sixth portion that is in contact with the fifth via conductor and disposed immediately above the fifth via conductor, and the third line-shaped portion connecting the fifth portion and the sixth portion,
when viewed in a direction perpendicular to the first main outermost surface of the multilayer body, a line width of the first line-shaped portion of the first in-plane conductor is narrower than a line width of the second line-shaped portion of the second in-plane conductor, and
when viewed in the direction perpendicular to the first main outermost surface of the multilayer body, a line width of the third line-shaped portion of the third in-plane conductor is narrower than the line width of the second line-shaped portion of the second in-plane conductor.

2. The multilayer wiring board according to claim 1, wherein a slit that passes through the first in-plane conductor in a thickness direction of the first in-plane conductor is provided in the first in-plane conductor.

3. The multilayer wiring board according to claim 1, wherein the first wiring layer includes a plurality of the first in-plane conductors; and
the first via conductor and the second via conductor are connected in parallel by the plurality of first in-plane conductors.

4. The multilayer wiring board according to claim 1, wherein a dummy via conductor is provided on a surface of the first in-plane conductor on the opposite side from the surface of the first in-plane conductor connected to the first via conductor, in a position that overlaps with the first via conductor when viewed in a direction perpendicular to the surface of the first in-plane conductor.

5. The multilayer wiring board according to claim 1, wherein a plurality of the insulating layers are provided between the outer electrode and the first wiring layer;
a thickness of an area between the outer electrode and the first wiring layer of each of the insulating layers is smaller than a thickness of other area of each of the insulating layers; and
the first via conductor comprises a continuous body constituted of a plurality of via elements, each via element passes through a corresponding one of the insulating layers between the outer electrode and the first wiring layer.

6. The multilayer wiring board according to claim 5, wherein some of the plurality of the insulating layers are provided between the first wiring layer and the second wiring layer;
a thickness of the area between the first wiring layer and the second wiring layer of each of the some of the plurality of the insulating layers is smaller than the other area of each of the insulating layers; and
the second via conductor comprises a continuous body constituted of a plurality of via elements, each via element passes through a corresponding one of the insulating layers between the first wiring layer and the second wiring layer.

7. The multilayer wiring board according to claim 1, wherein the first via conductor has a lower weight ratio of additives aside from a metal component than the second via conductor.

8. The multilayer wiring board according to claim 5, wherein in the plurality of via elements of the first via conductor, a weight ratio of additives aside from a metal component of the via element directly connected to the outer electrode is lower than a weight ratio of additives aside from a metal component of the other via element and the second via conductor.

9. The multilayer wiring board according to claim 1, wherein a thickness of the first in-plane conductor is smaller than a thickness of the second in-plane conductor.

10. The multilayer wiring board according to claim 1, wherein the first via conductor has a tapered shape that gradually becomes narrower toward the first in-plane conductor, and the second via conductor has a tapered shape that gradually becomes narrower toward the first in-plane conductor.

11. A probe card comprising the multilayer wiring board according to claim 1.

12. The multilayer wiring board according to claim 2, wherein the first wiring layer includes a plurality of the first in-plane conductors; and
the first via conductor and the second via conductor are connected in parallel by the plurality of first in-plane conductors.

13. The multilayer wiring board according to claim 2, wherein a dummy via conductor is provided on a surface of the first in-plane conductor on the opposite side from the surface of the first in-plane conductor connected to the first via conductor, in a position that overlaps with the first via conductor when viewed in a direction perpendicular to the surface of the first in-plane conductor.

14. The multilayer wiring board according to claim 3, wherein a dummy via conductor is provided on a surface of the first in-plane conductor on the opposite side from the surface of the first in-plane conductor connected to the first via conductor, in a position that overlaps with the first via conductor when viewed in a direction perpendicular to the surface of the first in-plane conductor.

15. The multilayer wiring board according to claim 2, wherein a plurality of the insulating layers are provided between the outer electrode and the first wiring layer;
a thickness of an area between the outer electrode and the first wiring layer of each of the insulating layers is smaller than a thickness of other area of each of the insulating layers; and
the first via conductor comprises a continuous body constituted of a plurality of via elements, each via element passes through a corresponding one of the insulating layers between the outer electrode and the first wiring layer.

16. The multilayer wiring board according to claim 3, wherein a plurality of the insulating layers are provided between the outer electrode and the first wiring layer;
a thickness of an area between the outer electrode and the first wiring layer of each of the insulating layers is smaller than a thickness of other area of each of the insulating layers; and
the first via conductor comprises a continuous body constituted of a plurality of via elements, each via element passes through a corresponding one of the insulating layers between the outer electrode and the first wiring layer.

17. The multilayer wiring board according to claim 4, wherein a plurality of the insulating layers are provided between the outer electrode and the first wiring layer;
a thickness of an area between the outer electrode and the first wiring layer of each of the insulating layers is smaller than a thickness of other area of each of the insulating layers; and
the first via conductor comprises a continuous body constituted of a plurality of via elements, each via element passes through a corresponding one of the insulating layers between the outer electrode and the first wiring layer.

18. The multilayer wiring board according to claim 2, wherein the first via conductor has a lower weight ratio of additives aside from a metal component than the second via conductor.

19. The multilayer wiring board according to claim 3, wherein the first via conductor has a lower weight ratio of additives aside from a metal component than the second via conductor.

20. The multilayer wiring board according to claim 4, wherein the first via conductor has a lower weight ratio of additives aside from a metal component than the second via conductor.

* * * * *